(12) United States Patent
Gauche et al.

(10) Patent No.: US 7,372,702 B2
(45) Date of Patent: May 13, 2008

(54) HEAT SPREADER

(75) Inventors: Paul Gauche, Portland, OR (US); Robert T. Jackson, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 379 days.

(21) Appl. No.: 11/021,324

(22) Filed: Dec. 23, 2004

(65) Prior Publication Data

US 2006/0139891 A1  Jun. 29, 2006

(51) Int. Cl.
  *H05K 7/20* (2006.01)
(52) U.S. Cl. .................. 361/719; 361/704; 361/719; 439/326; 439/331; 257/724; 257/727
(58) Field of Classification Search ............... 361/700, 361/704, 709, 710, 719, 707, 721; 257/718, 257/719, 727, 715, 722; 174/16.3, 52.1, 174/250; 165/80.3, 104.33, 185; 439/326, 439/331, 629, 630, 638
See application file for complete search history.

(56) References Cited

U.S. PATENT DOCUMENTS

| | | | | |
|---|---|---|---|---|
| 5,966,287 A | | 10/1999 | Lofland et al. | |
| 6,025,992 A | * | 2/2000 | Dodge et al. | 361/704 |
| 6,091,145 A | * | 7/2000 | Clayton | 257/724 |
| 6,188,576 B1 | * | 2/2001 | Ali et al. | 361/704 |
| 6,256,199 B1 | * | 7/2001 | Yusuf et al. | 361/699 |
| 6,278,609 B1 | * | 8/2001 | Suzuki et al. | 361/704 |
| 6,278,610 B1 | * | 8/2001 | Yasufuku et al. | 361/704 |
| 6,349,035 B1 | * | 2/2002 | Koenen | 361/719 |
| 6,468,101 B2 | * | 10/2002 | Suzuki | 439/326 |
| 6,483,702 B1 | * | 11/2002 | Lofland | 361/704 |
| 6,890,203 B2 | * | 5/2005 | Matsunaga et al. | 439/331 |
| 7,151,668 B1 | * | 12/2006 | Stathakis | 361/700 |

* cited by examiner

*Primary Examiner*—Boris Chervinsky
*Assistant Examiner*—Courtney L Smith
(74) *Attorney, Agent, or Firm*—Guojun Zhou

(57) ABSTRACT

According to some embodiments, an arrangement is provided for cooling a heat-generating device, including a memory module (e.g., a small outline dual inline memory module), in a system such as a laptop computer. The arrangement includes a heat spreader having a first section including at least one thermally conductive coupling member to thermally engage surfaces of electronic components on the heat-generating device and a second section including at least one spring member to cause pressurized engagement between the first section and the surfaces of the electronic components. The heat spreader may further be thermally coupled to a heat exchanger or a keyboard from which the heat is dissipated. Other embodiments are also described and claimed.

19 Claims, 17 Drawing Sheets

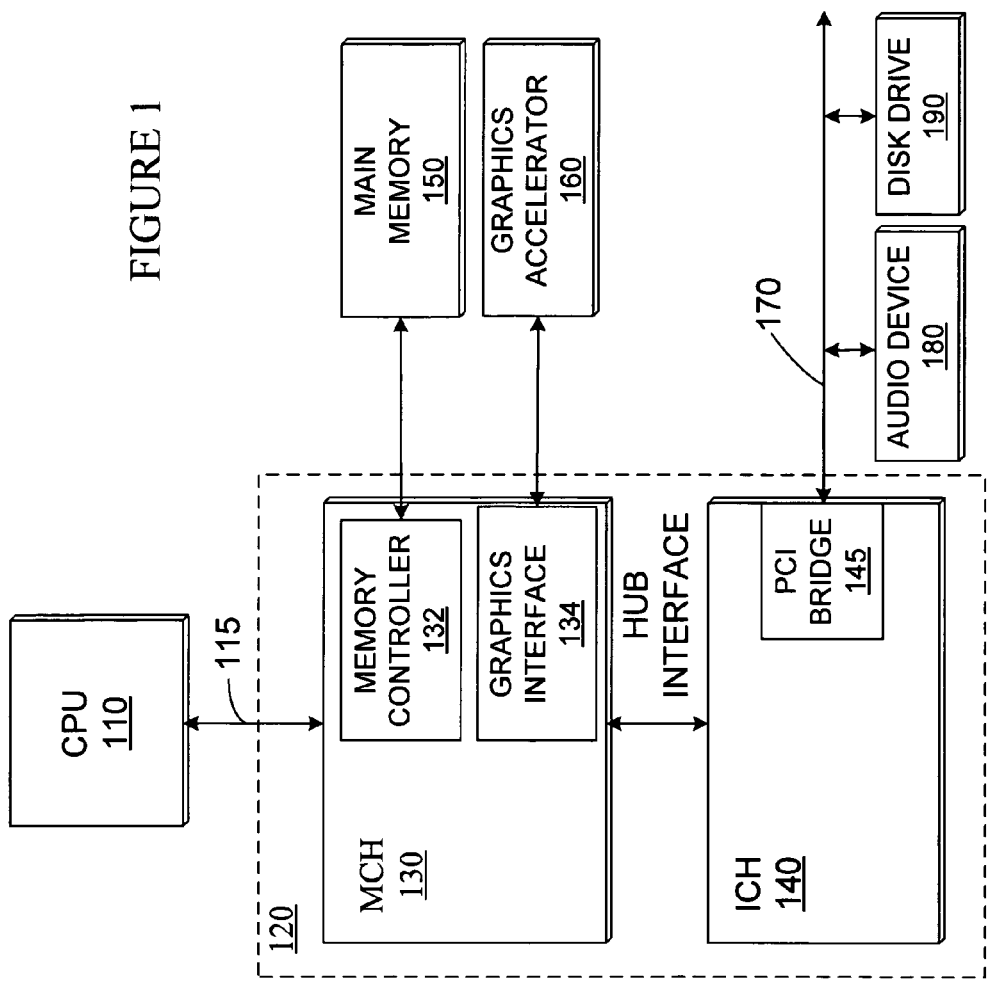

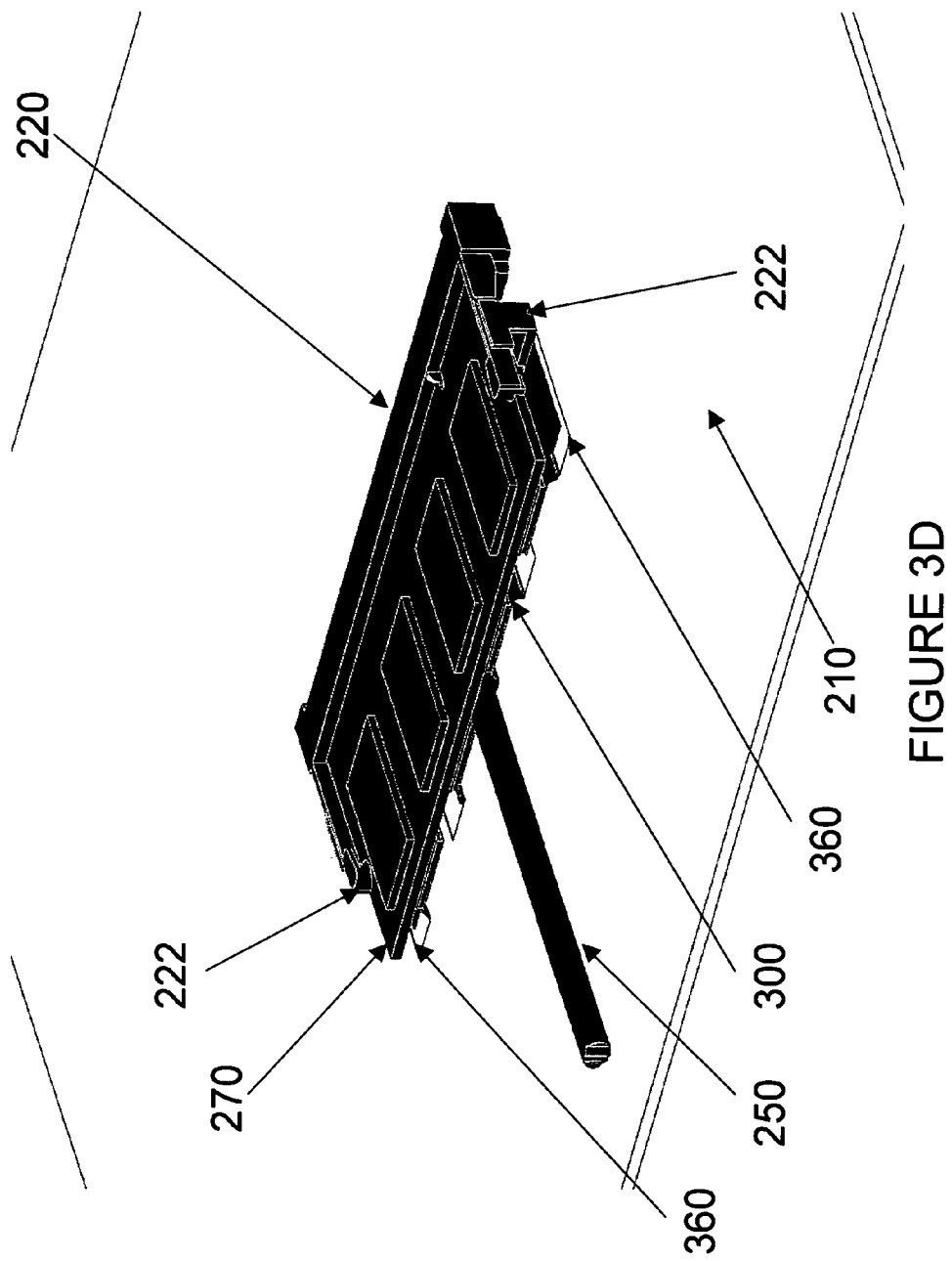

HEAT SPREADER

BACKGROUND

1. Field

This disclosure relates generally to cooling systems for integrated circuits and, more specifically, to a heat spreader for a small outline dual in-line memory module (SO-DIMM).

2. Description

As integrated circuits (e.g., central processing units (CPUs) in a computer system) become denser, components inside an integrated circuit chip are drawing more power and thus generating more heat. Various cooling systems have been used to dissipate heat generated by integrated circuit chips, for example within personal computers, mobile computers, or similar electrical devices.

Heat pipes/spreaders are commonly used in a cooling system to dissipate heat generated by integrated circuits (e.g., CPUs and chipsets) inside a computing system. Due to space limitations in today's compact computing systems, a traditional heat pipe/spreader may not work for every circuit inside a computer system, especially inside a laptop computer. For example, SO-DIMMs are often used in a laptop computer and space surrounding a SO-DIMM is so limited that a traditional heat pipe/spreader cannot fit. Thus, almost all laptop computers only rely on convective cooling for SO-DIMMs. However, as the capacity of a SO-DIMMM increases, circuits in a SO-DIMM become denser and as a result, more heat is generated. Convective cooling cannot remain effective in dissipating heat generated by a SO-DIMM as its capacity increases, especially by circuits on the motherboard side of the SO-DIMM, because these circuits typically receive even less convective cooling than circuits on the other side of the SO-DIMM.

BRIEF DESCRIPTION OF THE DRAWINGS

The features and advantages of the present disclosure will become apparent from the following detailed description of the present disclosure in which:

FIG. 1 illustrates an exemplary block diagram of a computer system which may be utilized to implement embodiments of the present disclosure;

FIGS. 3A-3E illustrate a second embodiment of a heat spreader, as described in the present disclosure, for a memory module in a laptop computer system;

DETAILED DESCRIPTION

Figure 2A:
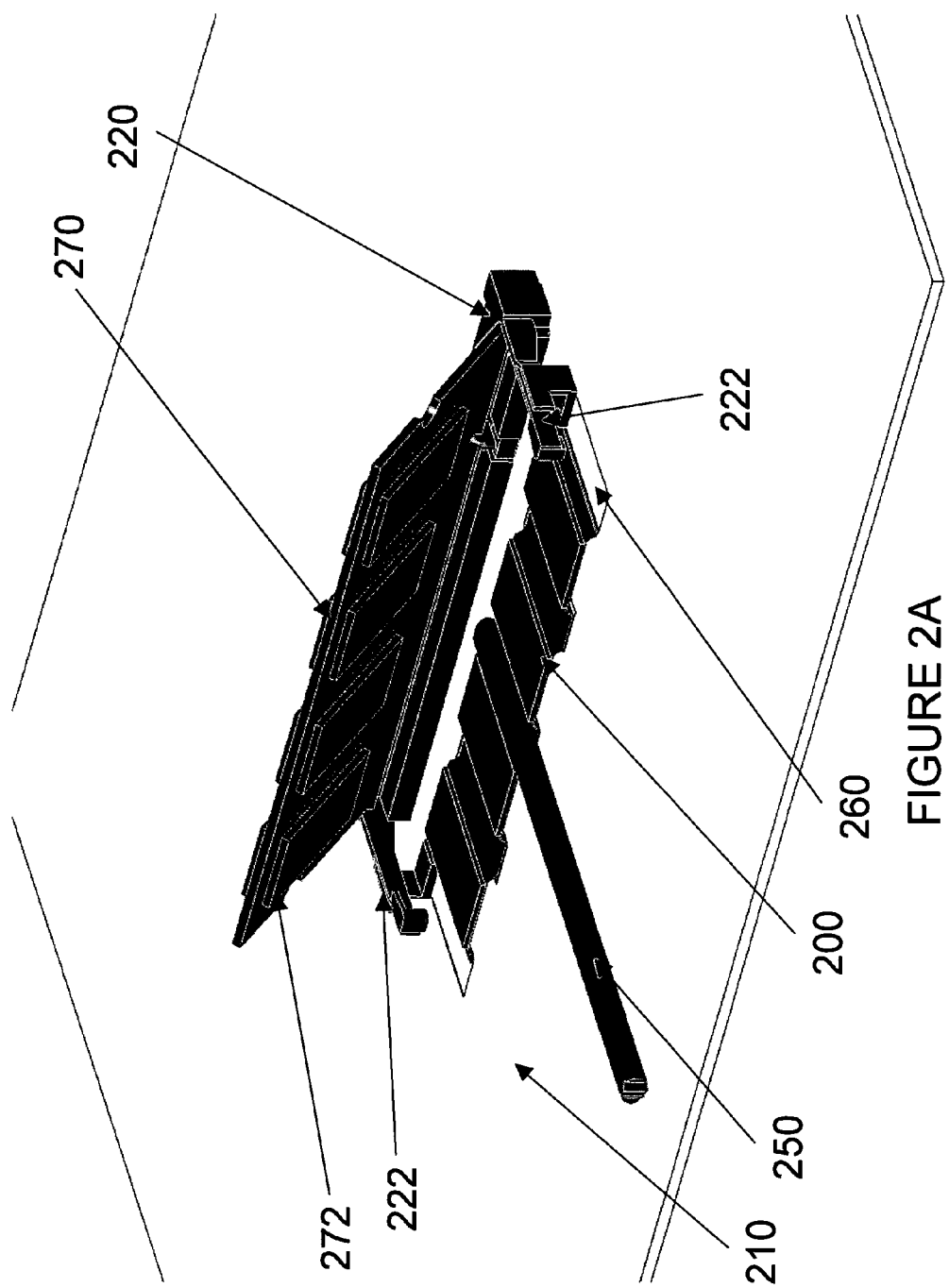
FIGS. 2A-2E illustrate a first embodiment of a heat spreader, as described in the present disclosure, for a memory module in a laptop computer system.

Memory modules (e.g., a SO-DIMM) in a mobile computing system (e.g., a laptop computer system) are typically inserted into a motherboard of a laptop computer system through pivot connectors. A memory module normally has two sides with both sides having circuits mounted thereon. When the memory module is locked into a pivot connector, electronic components on the side of the memory module that faces the motherboard typically receive less convective cooling than those on the other side of the memory module. This is partly because the space between the memory module and the motherboard is typically very small and partly because that space is partially enclosed by the structure of the pivot connector, which results in poor air circulation. Thus, convective cooling is not effective to dissipate heat generated by circuits on the motherboard side of a memory module.

According to an embodiment of the present disclosure, a heat spreader may be installed on the motherboard underneath a memory module. The heat spreader may comprise a coupling section and a spring section. The coupling section engages the surface of electronic components on the motherboard side of the memory module to improve heat transfer from the electronic components to the heat spreader. The spring section enables the heat spreader to be slightly higher than surfaces of the electronic components on the motherboard side of the memory module when the memory module is locked into a pivot connector. When the memory module is locked into the pivot connector, the spring section of the heat spreader may deform to improve engagement between the coupling section of the heat spreader and the surfaces of the electronic components on the motherboard side of the memory module. The heat spreader may enable dissipating heat generated by the electronic components on the motherboard side of the memory module. The heat spreader may also connect to a heat pipe and/or another heat spreader which helps transfer heat from the heat spreader to the outside of the computer system.

Reference in the specification to "one embodiment" or "an embodiment" of the present invention means that a particular feature, structure or characteristic described in connection with the embodiment is included in at least one embodiment of the present invention. Thus, the appearances of the phrase "in one embodiment" appearing in various places throughout the specification are not necessarily all referring to the same embodiment.

FIG. 1 illustrates an exemplary block diagram of a computer system which may be utilized to implement embodiments of the present invention. Although not shown, the computer system is envisioned to receive electrical power from a direct current (DC) source (e.g., a battery) and/or from an alternating current (AC) source (e.g., by connecting to an electrical outlet). The computer system comprises a central processing unit (CPU) or processor 110 coupled to a bus 115. For one embodiment, the processor 110 may be a processor available from Intel Corporation (e.g., a Pentium® M processor). Alternatively, other processors from other manufacturers may also be used.

The computer system as shown in FIG. 1 may also include a chipset 120 coupled to the bus 115. The chipset 120 may include a memory control hub (MCH) 130 and an input/output control hub (ICH) 140. The MCH 130 may include a memory controller 132 that is coupled to a main memory 150. The main memory 150 may store data and sequences of instructions that are executed by the processor 110 or any other device included in the system. For one embodiment, the main memory 150 may include one or more of dynamic random access memory (DRAM), read-only memory (RAM), FLASH memory, etc. The MCH 130 may also include a graphics interface 134 coupled to a graphics accelerator 160. The graphics interface 134 may be coupled to the graphics accelerator 160 via an accelerated graphics port (AGP) that operates according to an AGP Specification Revision 2.0 interface developed by the Intel Corporation. A display (not shown) may be coupled to the graphics interface 134.

The MCH 130 may be coupled to the ICH 140 via a hub interface. The ICH 140 provides an interface to input/output (I/O) devices within the computer system. The ICH 140 may be coupled to a Peripheral Component Interconnect (PCI) bus. The ICH 140 may include a PCI bridge 145 that provides an interface to a PCI bus 170. The PCI Bridge 145 may provide a data path between the CPU 110 and peripheral devices such as, for example, an audio device 180 and a disk drive 190. Although not shown, other devices may also be coupled to the PCI bus 170 and the ICH 140.

As more advanced software applications become available, demand for a larger capacity main memory 150 increases. The increased capacity in turn results in more heat generated by the main memory 150.

Figure 2B:
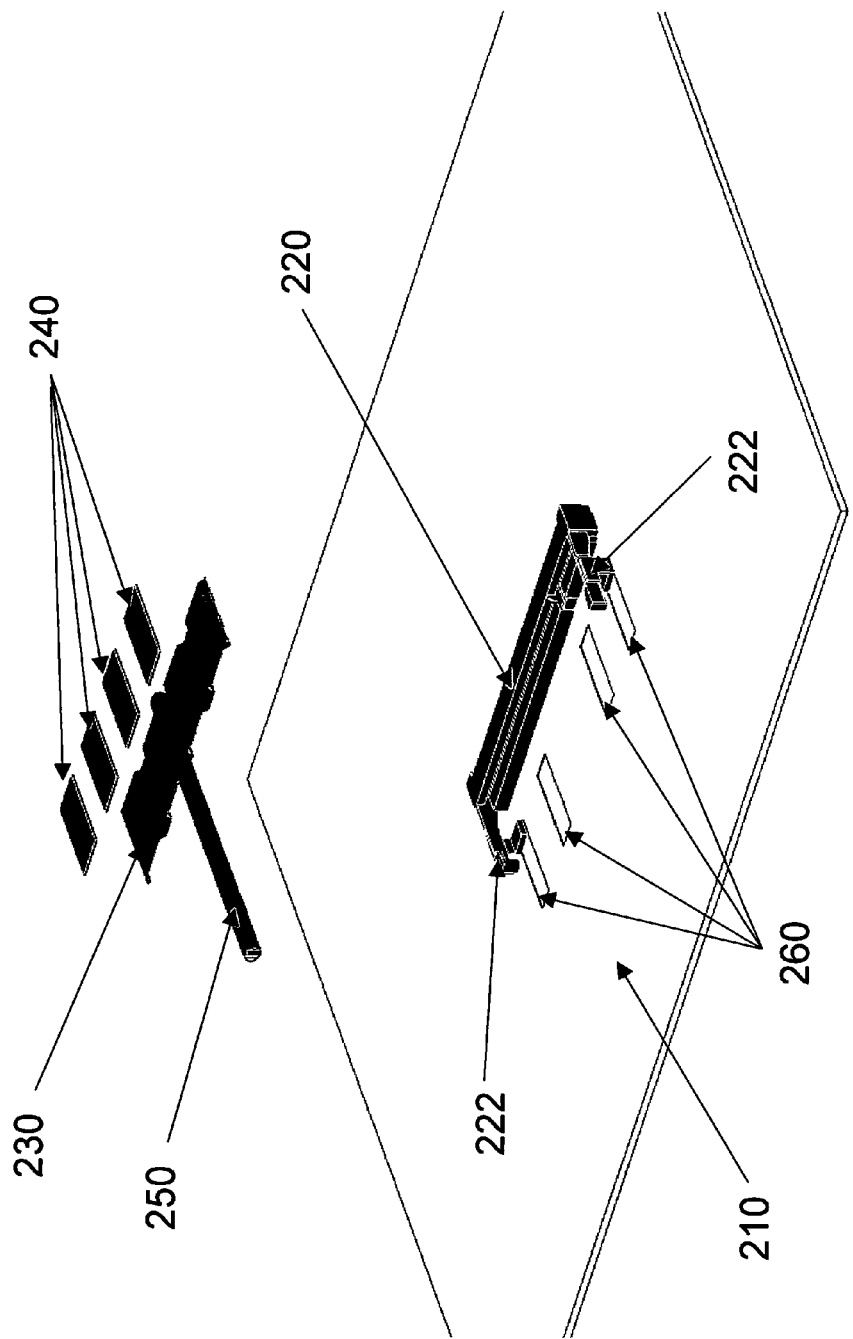
Figure 2C:
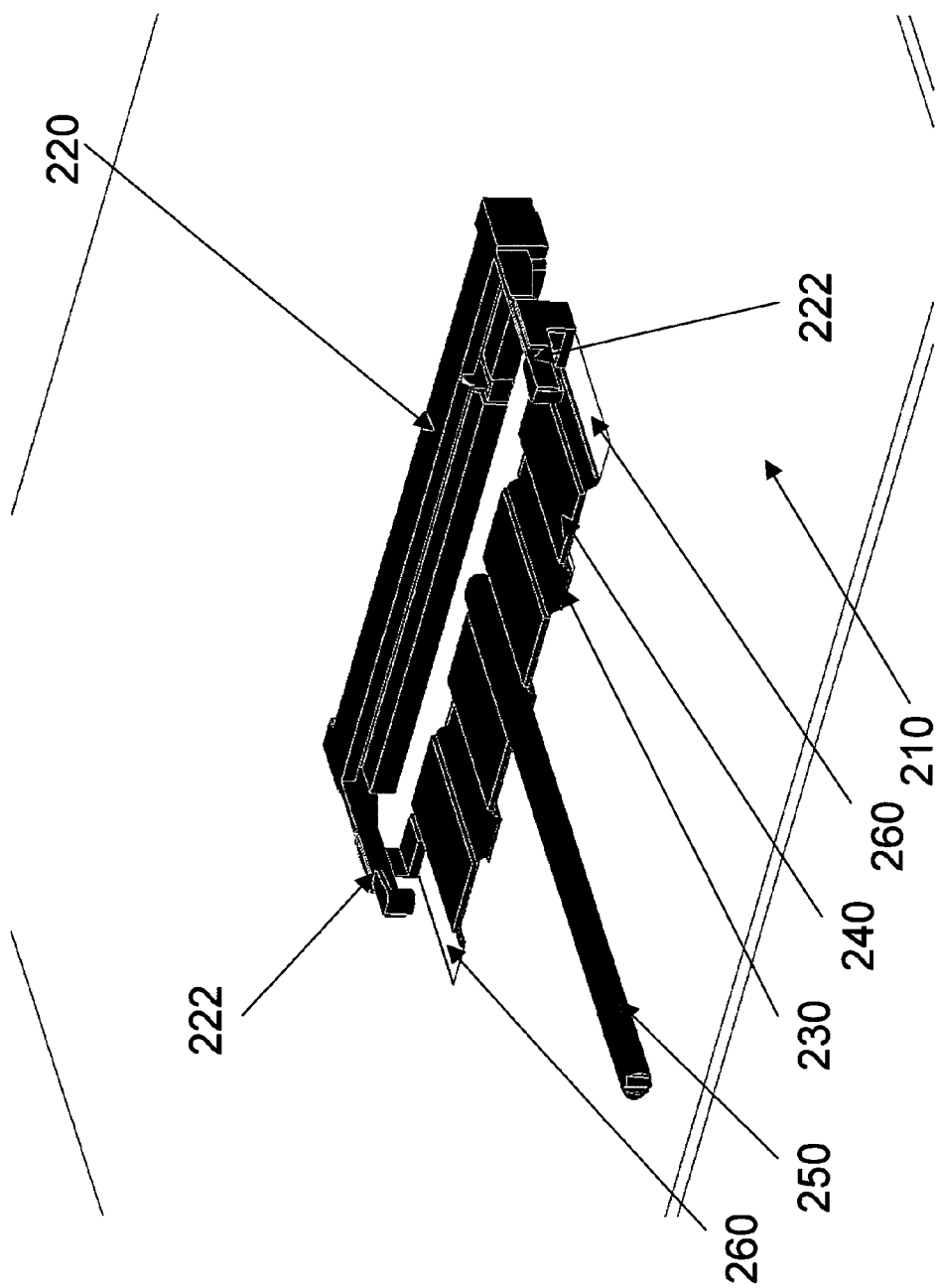
Figure 2D:
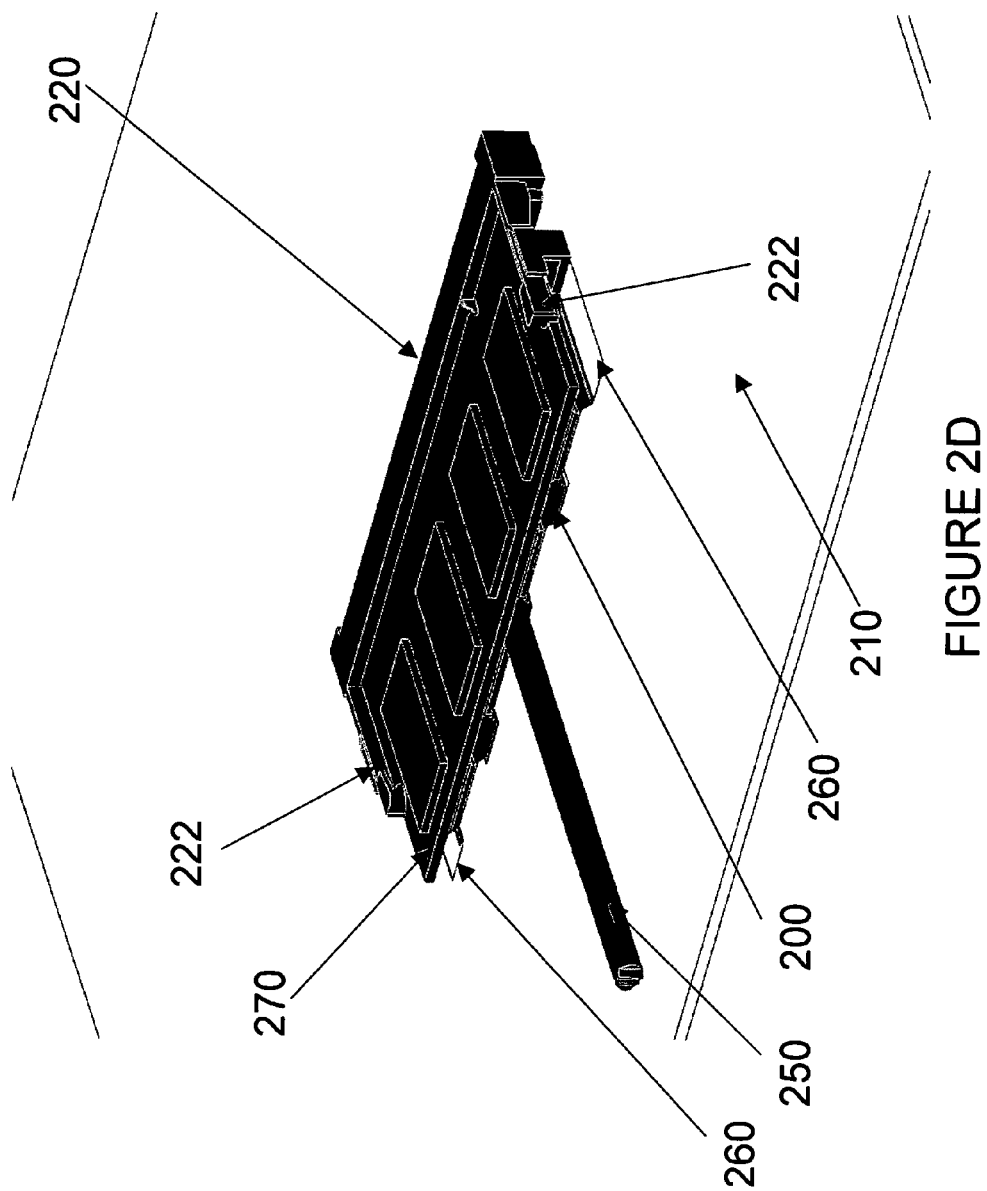

FIGS. 2A-2E depict one example of a heat spreader 200 that may be used to cool a memory module including, for example, electronic component on the motherboard side of the memory module. As shown in FIG. 2A, the heat spreader 200 may be installed on a motherboard 210 onto which a pivot connector 220 for a memory module 270 (e.g., a SO-DIMM) is connected. The pivot connector 220 may comprise a pair of clips 222 to releasably lock the memory module when the memory module 270 comes to rest in ("clips into") the pivot connector 220 (as shown in FIG. 2D). When the memory module 270 is locked into the pivot connector, the heat spreader 200 may engage surfaces of electronic components (e.g., 272) on the motherboard side of the memory module 270 to remove heat generated by these electronic components. Additionally, the heat spreader 200 may be thermally coupled to a heat pipe 250 to facilitate transfer heat from the heat spreader 200 to a heat exchanger (not shown in FIG. 2A) from which heat is dissipated into the ambient air or outside of a computer system in which the motherboard is located.

As shown in FIG. 2B, the heat spreader 200 may comprise a coupling section 240 and a spring section 230. The coupling section 240 may comprise multiple members, each corresponding to one electronic component (e.g., 272 as shown in FIG. 2A) mounted on the motherboard side of the memory module. Each coupling member is so shaped (e.g., a flat rectangular sheet) to provide good engagement with the surface of its corresponding electronic component to facilitate heat transfer from the electronic component to the heat spreader. Coupling members attach the heat spreader 200 to the surfaces of electronic components on the motherboard side of the memory module. Each coupling member is constructed of a thermally conductive material that has high heat transferability, for example, metal (e.g., copper and aluminum), metal alloy, any other suitable materials, or a mixture thereof. Although not shown in FIG. 2B, there may be a layer of non-permanent thermal interface material placed on the top of each coupling member to provide substantially close thermal engagement between the top surface of a coupling member and the surface of the coupling member's corresponding electronic component on the motherboard side of the memory module, when the memory module is locked into the pivot connector. The close thermal engagement helps improve heat transferring efficiency from the surface of the corresponding electronic component to the coupling member. The non-permanent thermal interface material is thermally conductive.

The spring section 230 of the heat spreader 200 may comprise a member which is so shaped to form several arches, each of which has a leveled top. The number of arches corresponds to the number of coupling members in the coupling section 240. A coupling member is coupled to a leveled top of one arch in the spring member (as shown in FIG. 2C) through means such as rivets, a stamping feature of the coupling member, and adhesive material. The spring member is constructed of a thermally conductive and flexible material so that it has both high heat transferability and good flexibility/recoverability. The shape of the spring member may allow the spring member to deform when pressure is exerted on the top. For example, when relaxed (e.g., the memory module is released from the pivot connector), the spring member may cause the top surfaces of the coupling members to be slightly higher than the plane in which the surfaces of electronic components on the motherboard side of the memory module would be had the memory module locked into the pivot connector. When the memory module is locked into the pivot connector, the memory module may press the top surfaces of the coupling members to cause the spring member of the heat spreader to deform to provide pressurized engagement between the top surfaces of the coupling members and the surfaces of the electronic components.

Note that not all the electronic components on the motherboard side of the memory module may have the same height. As a result, the surfaces of these electronic components might not exactly fall into the same plane. However, the height variations among the electronic components are typically not significant in a memory module and thus the surfaces of these electronic components substantially fall into the same plane, which is parallel to the motherboard. Even if the surfaces of the electronic components do not substantially fall into the same plane, the height of corresponding coupling member and layer of non-permanent thermal interface material may be adjusted to accommodate the height variations among the electronic components so that pressurized engagement between the top surface of a coupling member and the surface of a corresponding electronic component can still be achieved.

The pressurized engagement may provide closer engagement between the top surfaces of the coupling members and the surfaces of the electronic components than an unpressurized fit. As a result, heat generated by the electronic components may be more efficiently transfer from the surfaces of the electronic components to the coupling members and from there to the spring member. The spring section 230 may be thermally coupled to a heat pipe 250 so that the heat may be further transferred from the spring member to the heat pipe, which transfers the heat to a heat exchanger. The heat exchanger may then dissipate the heat into ambient air inside a computer system or directly into outside of the computer system.

To avoid any damage to the motherboard or electronic circuits on the motherboard and to prevent the heat spreader/heat pipe from electronically disturbing electronic components on the motherboard, a number of ground pads 260 may be used to provide some cushion as well as insulation between the heat spreader/heat pipe and the motherboard or components on the motherboard. The heat spreader/heat pipe makes contacts with these ground pads without making contacts with the motherboard or electronic components on the motherboard. Although FIG. 2B shows a number of separate ground pads, a single continuous ground pad that covers the entire area underneath the spring member of the heat spreader may also be used.

Figure 2E:
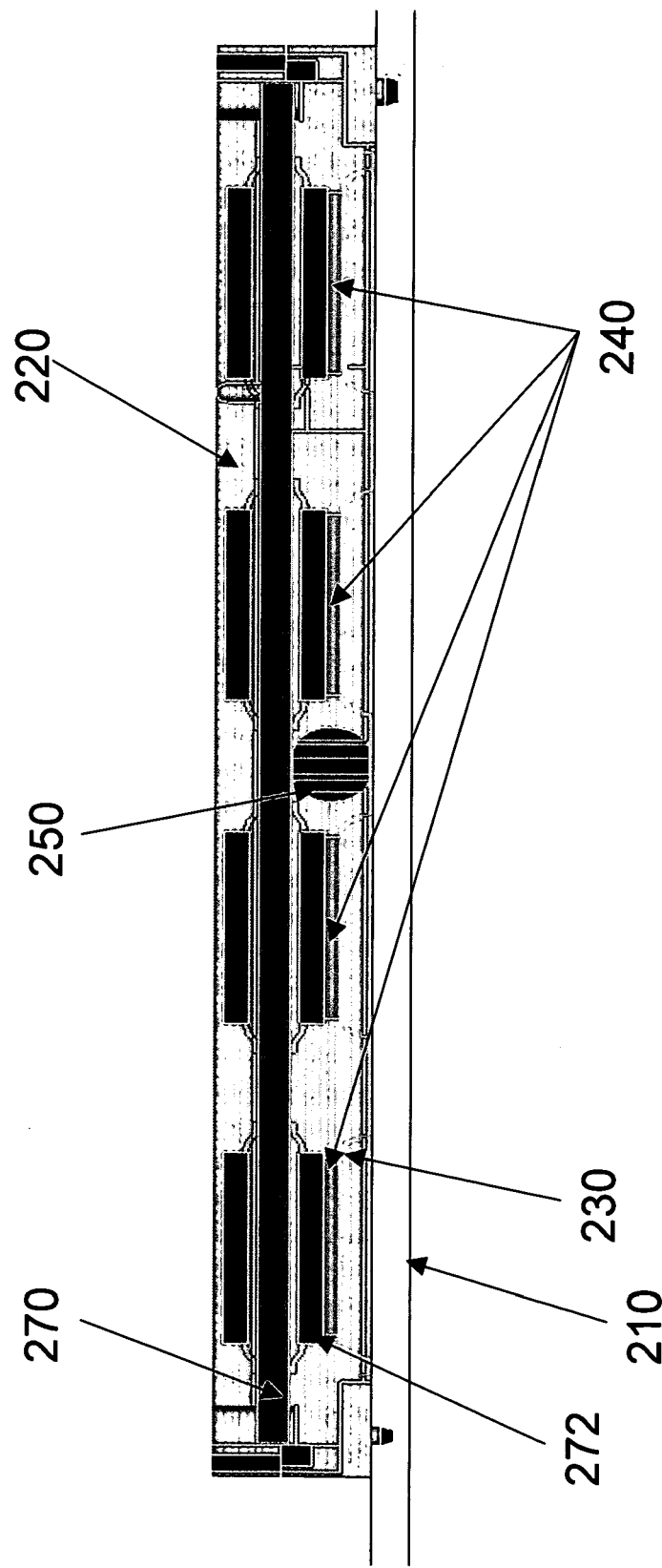

FIG. 2C shows an example with the heat spreader 200 assembled and rests on the motherboard. The heat spreader may be stabilized by coupling either to the motherboard 210, or to the pivot connector 220, or both. The coupling between the heat spreader and the motherboard/pivot connector may be established through any means such as adhesive means, rivets, clips, etc. FIG. 2D shows an example with the heat spreader 200 placed underneath the memory module 270 when the memory module is locked into the pivot connector 220. Although not shown in FIG. 2D, the heat spreader, especially the spring member may be made large enough to extend outwardly (i.e., in an opposite direction toward the pivot connector) beyond the edge of the memory module when the memory module is locked into the pivot connector. FIG. 2E shows a cross-sectional diagram of relationships between the coupling section 240 and the spring section 230 of the heat spreader 200, and between the heat spreader 200, the pivot connector 220, the motherboard 210, and the memory module 270 when the memory module is locked into the pivot connector.

Figure 3A:
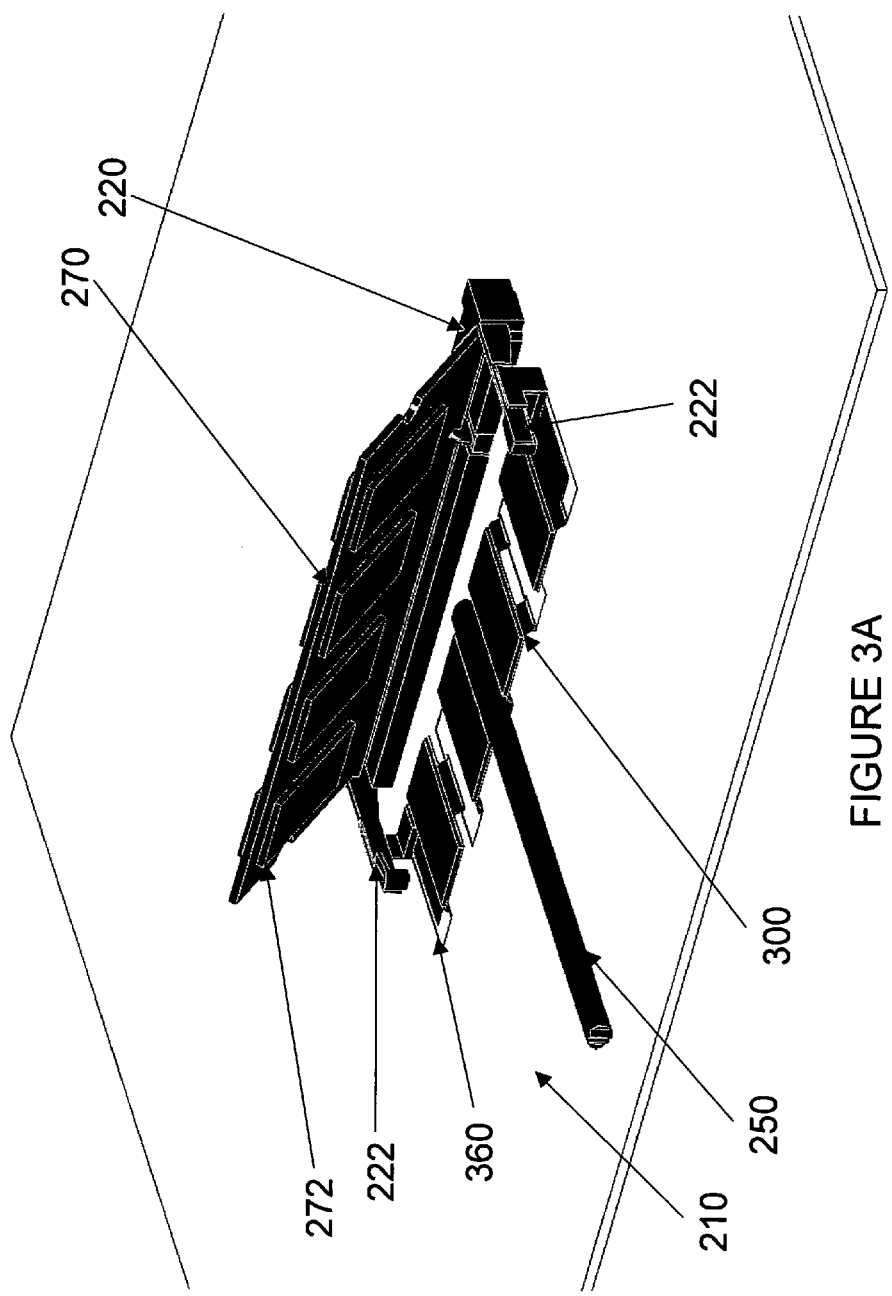
Figure 3B:
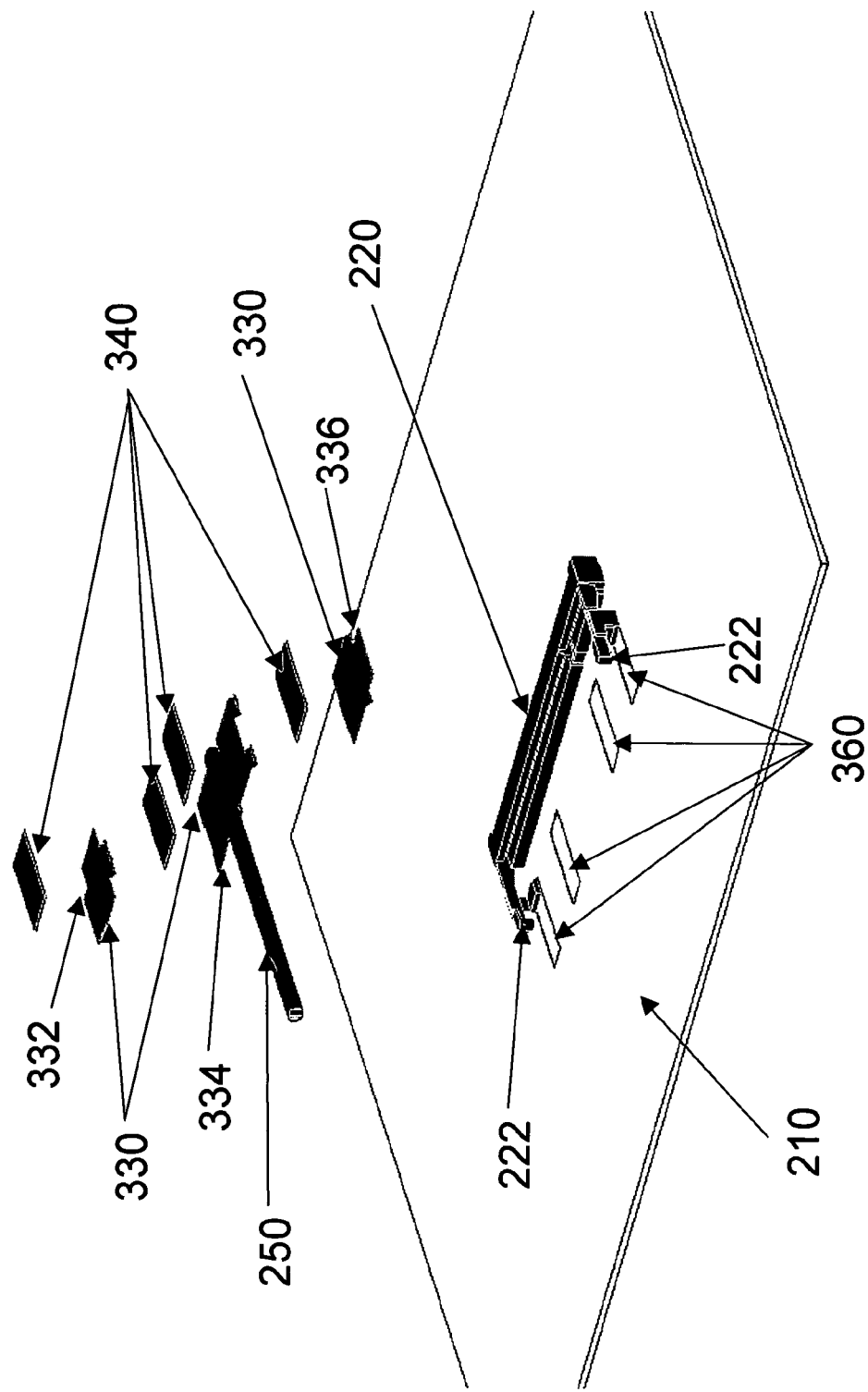

FIGS. 3A-3E depict another example of a heat spreader 300 that may be used to cool a memory module including, for example, components on the motherboard side of the memory module. In the interest of brevity, only those parts that are different from the example shown in FIGS. 2A-2E will be described. As shown in FIG. 3A, the heat spreader 300 may be installed on a motherboard 210 onto which a pivot connector 220 for a memory module 270 (e.g., a SO-DIMM) is connected. As shown in FIG. 3B, the heat spreader 300 may comprise a coupling section 340 and a spring section 330. The coupling section 340 here may comprise multiple members similar to the coupling members in the coupling section 240 of the heat spreader 200 as shown in FIG. 2B.

Figure 3C:
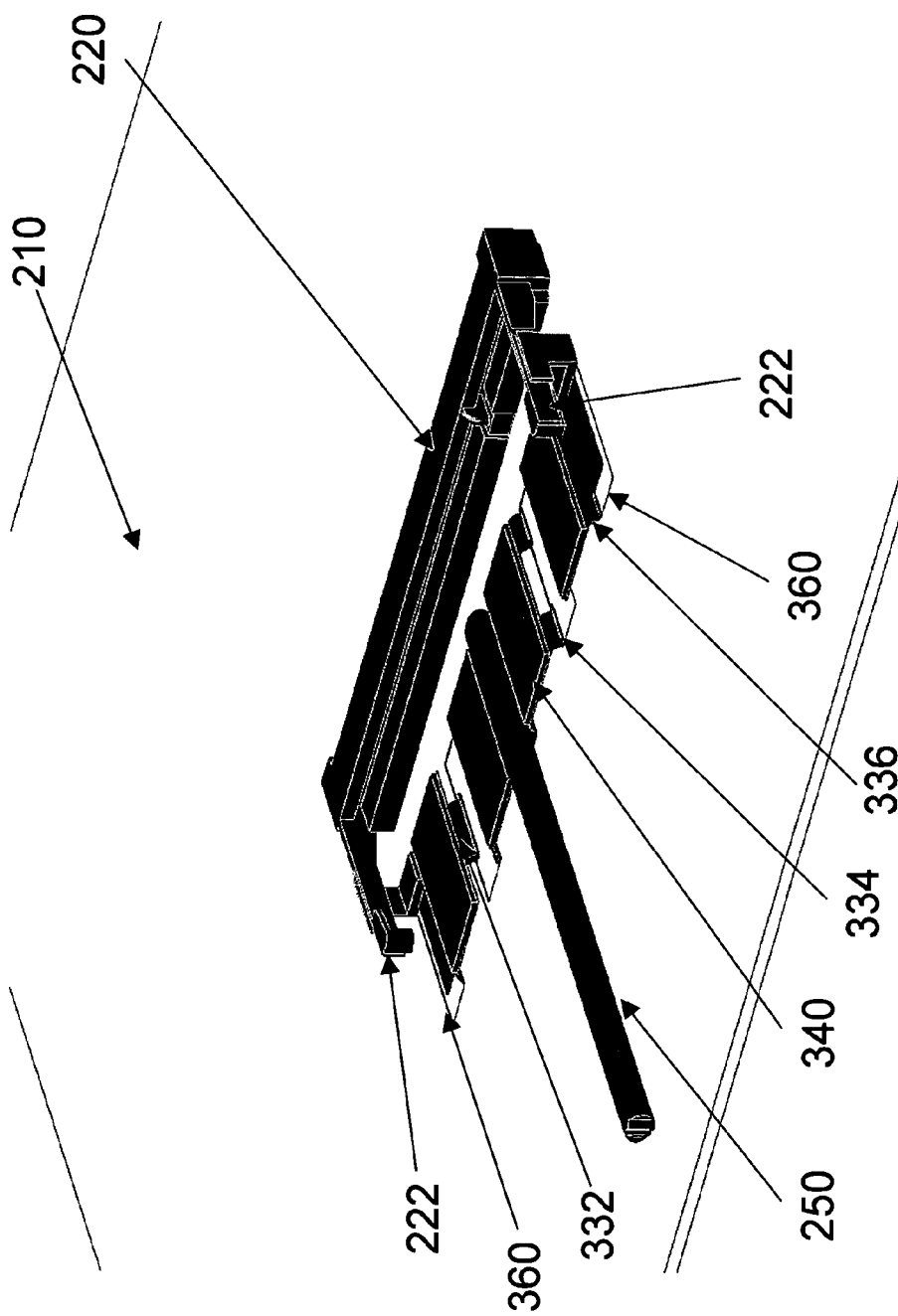

As shown in FIG. 3B, the spring section 330 of the heat spreader 300 may comprise a group of separate members, for example 332, 334, and 336. Each spring member may be arch-/quasi-arch-shaped as shown in the figure and has at least one leveled top so that one or more coupling members can couple closely to a spring member. The total number of arches/quasi-arches in all of the spring members corresponds to the number of coupling members in the coupling section 340. For example, a coupling member may couple with each of spring members 332 and 336 by placing the coupling member on the top surface of a spring member; and two coupling members may couple with spring member 334 by placing a coupling member on the top surface of the leveled top of each arch, as shown in FIG. 3C. In one embodiment, a coupling member is coupled to a leveled top of an arch in a spring member through means such as rivets, a stamping feature of the coupling member, or adhesive material. The spring members are constructed of a thermally conductive and flexible material so that it has both high heat transferability and good flexibility/recoverability. The shape of the spring members allows the spring member to deform, when pressure is exerted on the top, to provide a pressurized fit between the top surfaces of the coupling members and the surfaces of the electronic components.

Spring member 334 may be thermally coupled to a heat pipe 250 so that the heat may be further transferred from spring members to the heat pipe, which transfers the heat to a heat exchanger. To avoid any damage to the motherboard or electronic circuits on the motherboard and to prevent the heat spreader/heat pipe from electronically disturbing electronic components on the motherboard, a number of ground pads 360 may be used to provide some cushion as well as insulation between the heat spreader/heat pipe and the motherboard or components on the motherboard. Although FIG. 3B shows a number of separate ground pads, a single continuous ground pad that covers the entire area underneath the spring member of the heat spreader may also be used. To facilitate all of the coupling and spring members to transfer the heat to the heat pipe, all spring members (e.g., 332, 334, and 336) may be thermally coupled to each other when the heat spreader 300 is assembled as shown in FIG. 3C. For example, spring member 332 or 336 may be thermally coupled with spring member 334 by physically connecting to each other when assembled or through a thermally conductive material on the top of group pads between spring members 332/336 and 334.

Figure 3E:
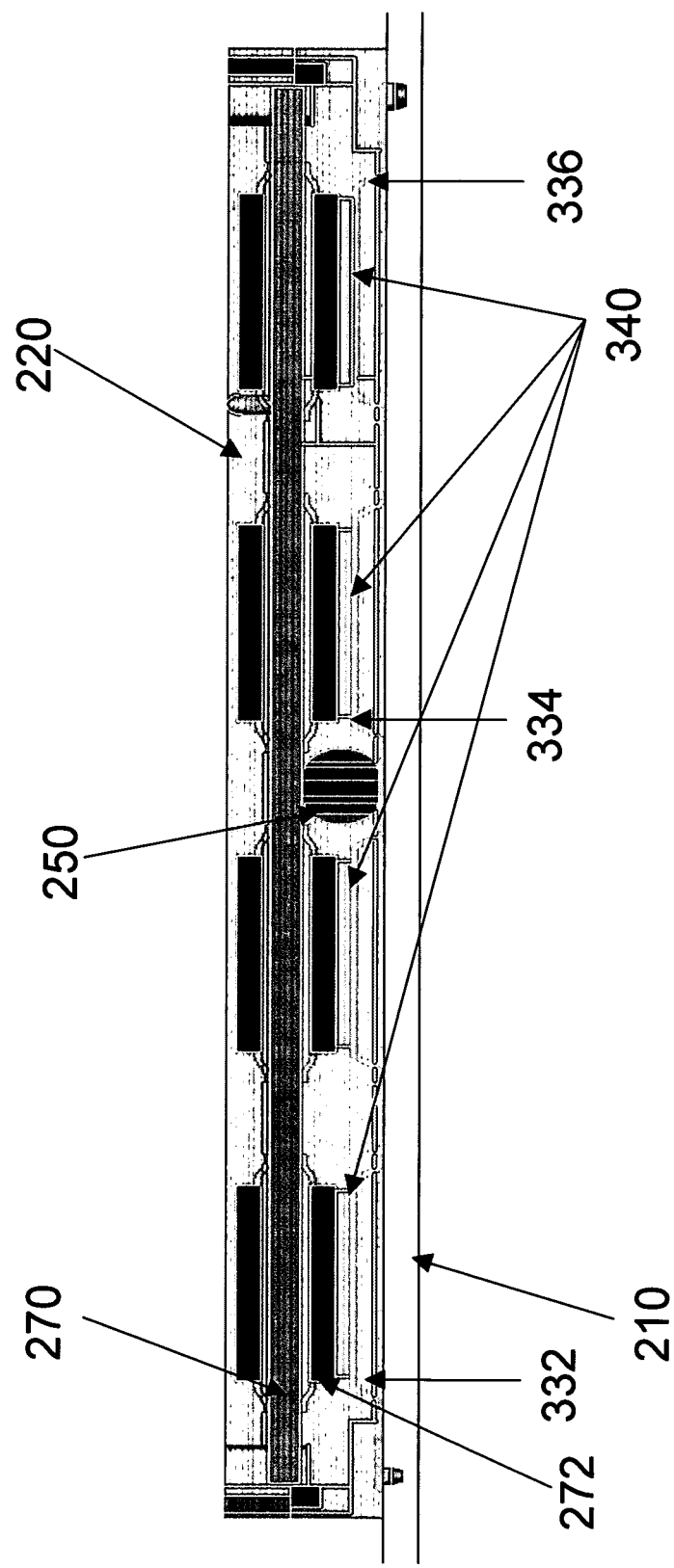

FIG. 3D shows an example with the heat spreader 300 placed underneath the memory module 270 when the memory module is locked into the pivot connector 220. Although not shown in FIG. 3D, the heat spreader, including the spring member, may be made large enough to extend outwardly (i.e., in an opposite direction toward the pivot connector) beyond the edge of the memory module when the memory module is locked into the pivot connector. FIG. 3E shows a cross-sectional diagram of relationships between the coupling section 340 and the spring section 330 (including spring members 332, 334, and 336) of the heat spreader 300, and between the heat spreader 300, the pivot connector 220, the motherboard 210, and the memory module 270 when the memory module is locked into the pivot connector.

Figure 4A:
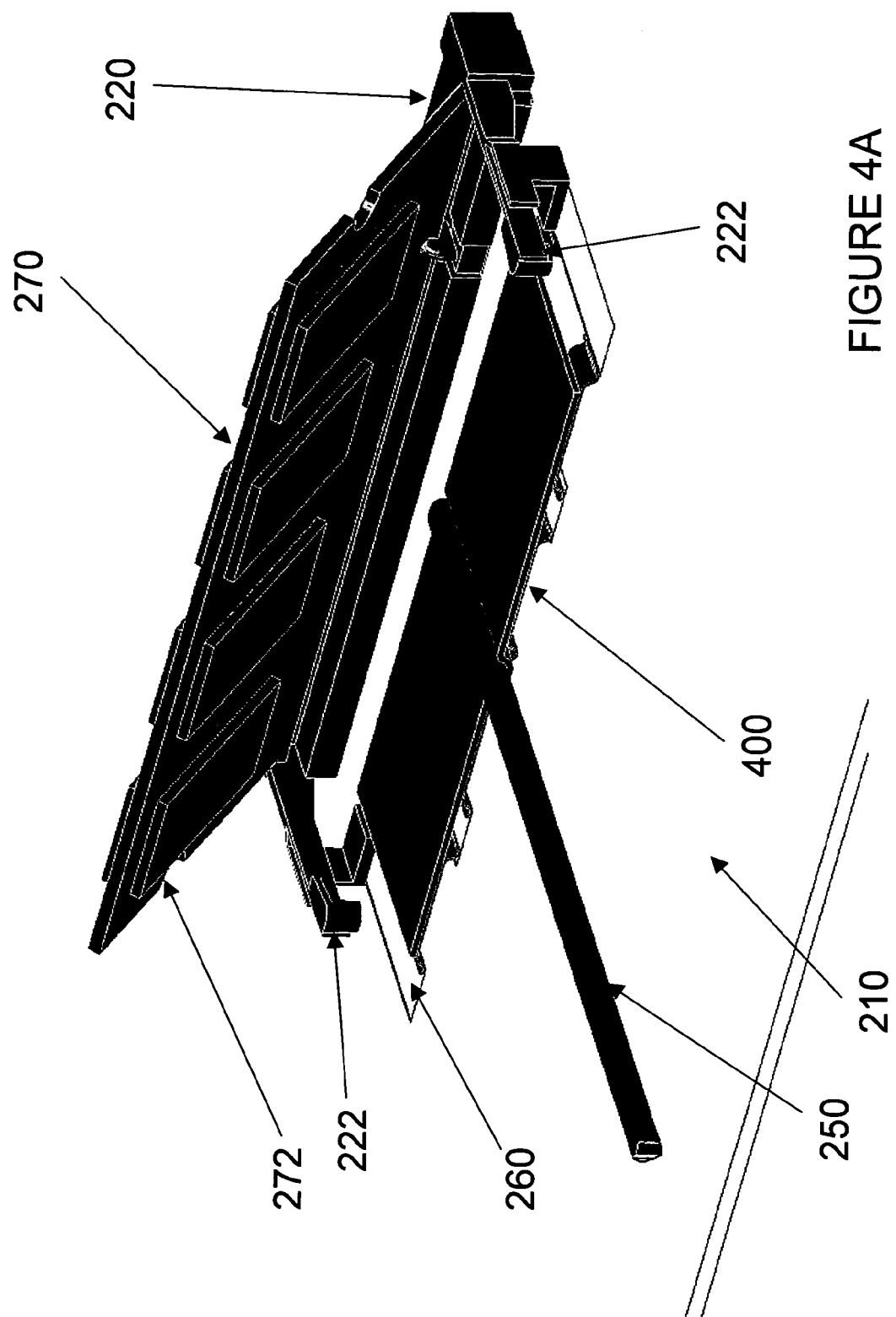
FIGS. 4A-4E illustrate a third embodiment of a heat spreader, as described in the present disclosure, for a memory module in a laptop computer system.
Figure 4B:
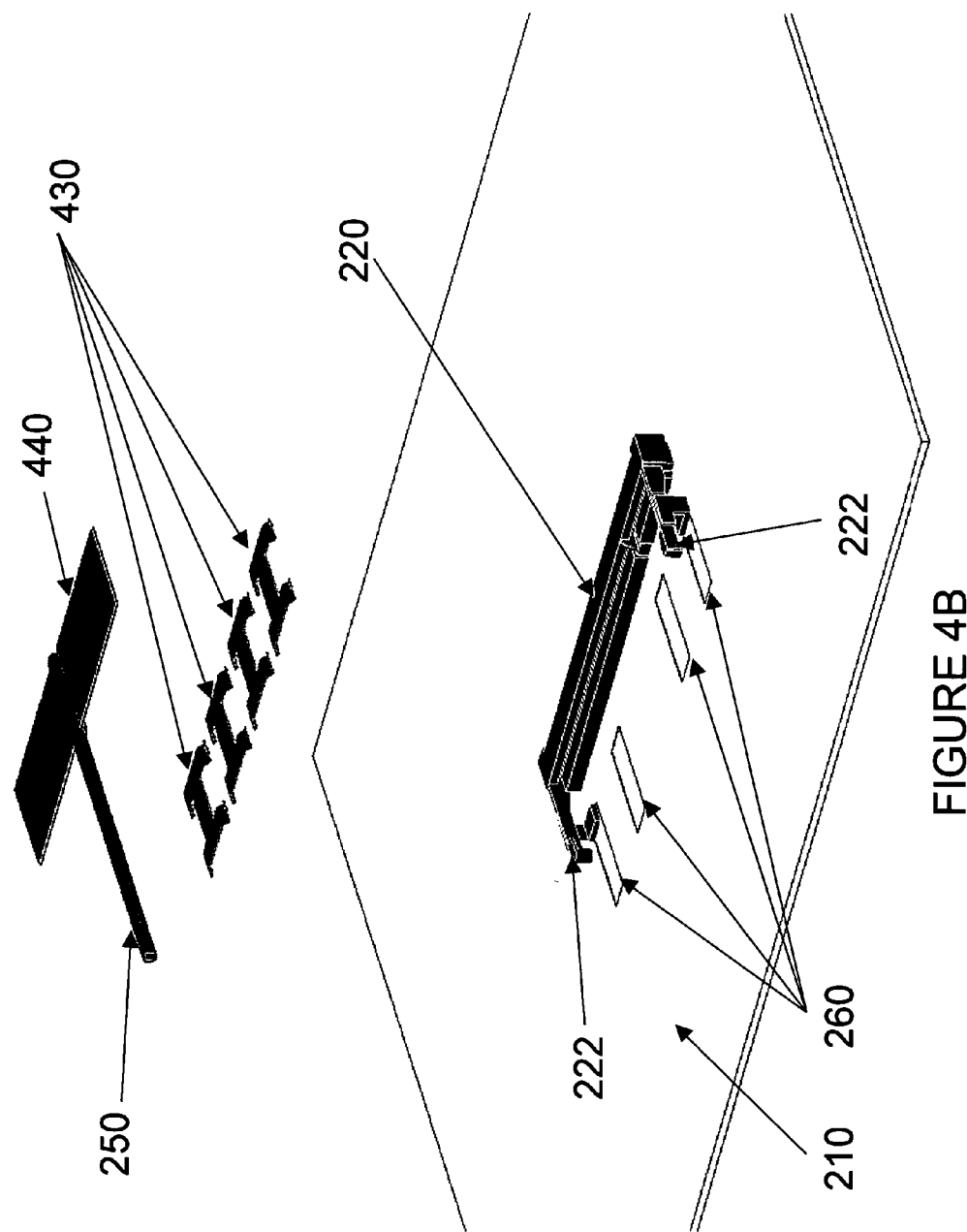

FIGS. 4A-4E depict another example of a heat spreader 400 that may be used to cool a memory module including, for example, electronic components on the motherboard side of the memory module. In the interest of brevity, only those parts that are different from the example shown in FIGS. 2A-2E will be described. As shown in FIG. 4A, the heat spreader 400 may be installed on a motherboard 210 onto which a pivot connector 220 for a memory module 270 (e.g., a SO-DIMM) is connected. As shown in FIG. 4B, the heat spreader 400 may comprise a spring section 430 and a coupling section 440. The coupling section 440 here may comprise a single member which is thermally coupled to a heat pipe 250. The top surface of the coupling member may be so configured to provide good engagement between the coupling member and surfaces of electronic components (e.g., 272 as shown in FIG. 4A) on the motherboard side of the memory module to facilitate heat transfer from the electronic components to the heat spreader. The coupling member is constructed of a thermally conductive material that has high heat transferability, for example, metal (e.g., copper and aluminum), metal alloy, any other suitable materials, or a mixture thereof. Although not shown in FIG. 4B, there may be multiple pieces of non-permanent thermal interface material placed on the top of the coupling member to provide substantially close thermal engagement between the top surface of the coupling member and surfaces of electronic components on the motherboard side of the memory module. The close thermal engagement help improve heat transferring efficiency from the surfaces of the electronic components to the coupling member. The number of pieces of non-permanent thermal interface material may correspond to the number of the electronic components on the motherboard side of the memory module. The surface size of each piece of non-permanent thermal interface material may be substantially equal to (or larger or smaller than) the surface size of each corresponding electronic component. The non-permanent thermal interface material is thermally conductive.

As shown in FIG. 4B, the spring section 430 of the heat spreader 300 may comprise a plurality of separate members. Each spring member may be in quasi-arch shape as shown in the figure and has a top so configured to fit with the coupling member. In one embodiment, the coupling member is coupled to the top surface of a spring member through means such as rivets, a stamping feature of the coupling member, or adhesive material. The spring members are constructed of a flexible material so that they have good flexibility/recoverability. The shape of the spring members allows the spring member to deform, when pressure is exerted on the top, to provide a pressurized fit between the top surfaces of the coupling members and the surfaces of the electronic components.

Figure 4C:
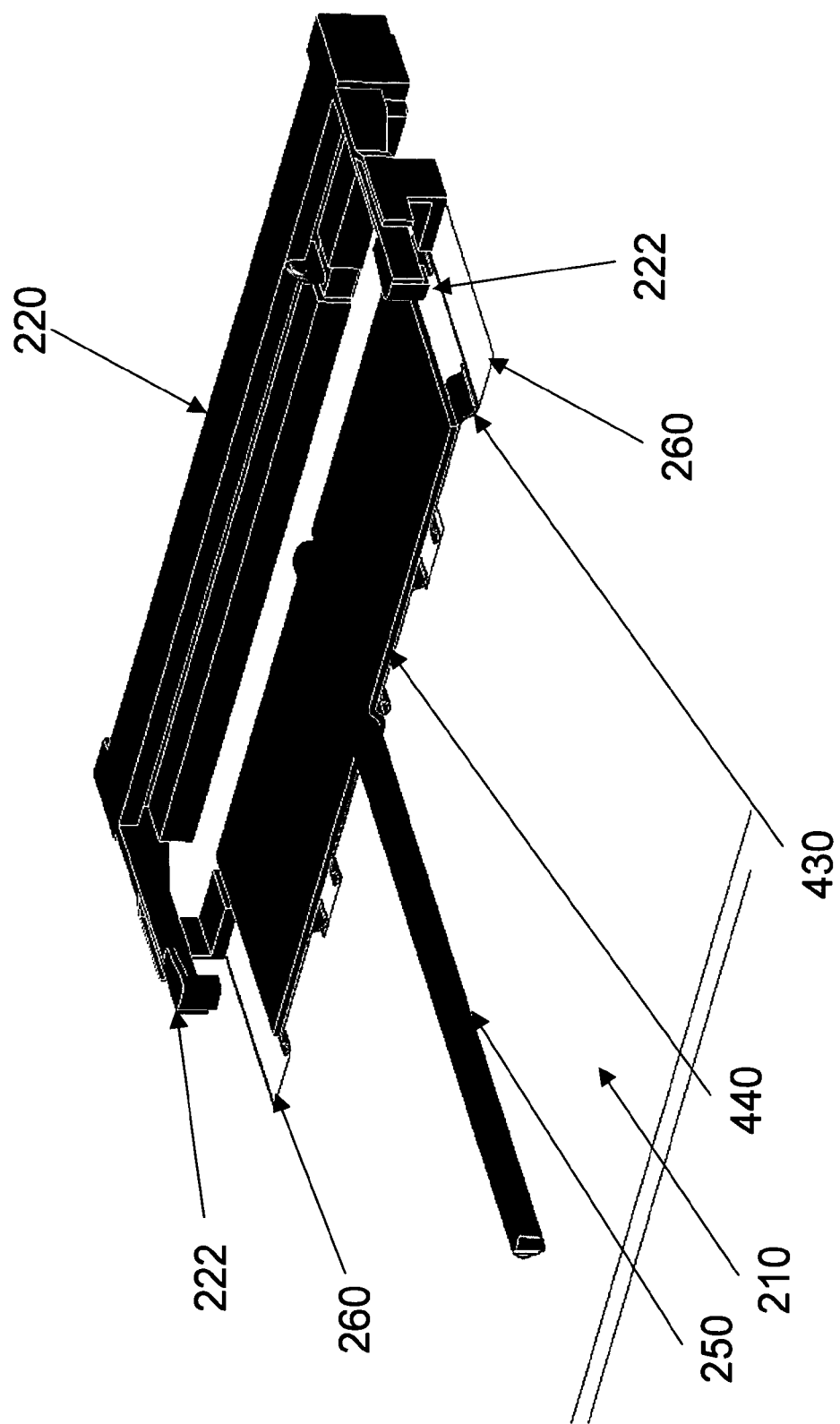
Figure 4D:
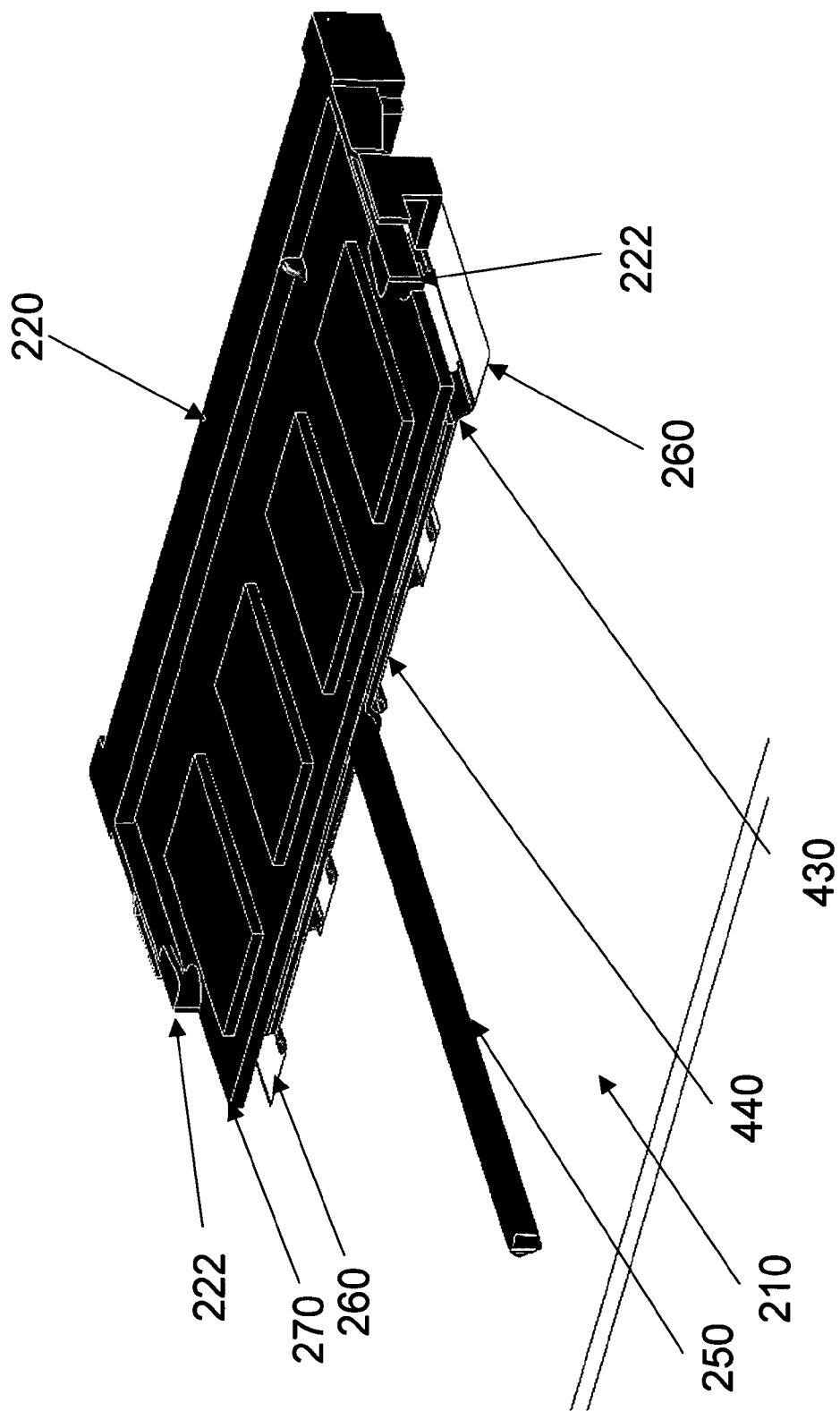
Figure 4E:
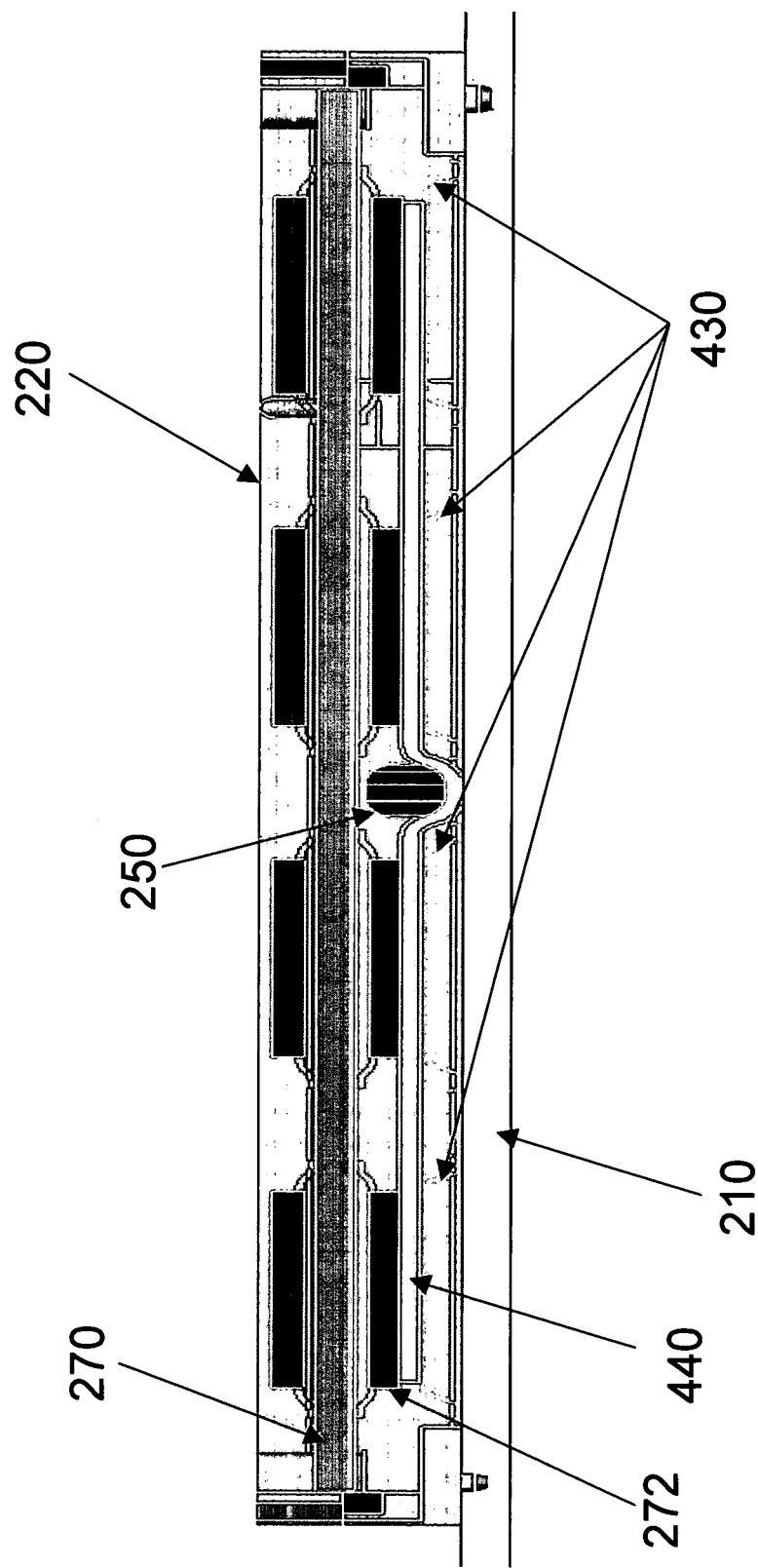

FIG. 4C shows that the heat spreader 400 is assembled and rests on the motherboard. The heat spreader may be stabilized by coupling either to the motherboard 210, or to the pivot connector 220, or both. FIG. 4D shows that the heat spreader 400 is placed underneath the memory module 270 when the memory module is locked into the pivot connector 220. Although not shown in FIG. 4D, the heat spreader, especially the spring member may be made large enough to extend outwardly (i.e., in an opposite direction toward the pivot connector) beyond the edge of the memory module when the memory module is locked into the pivot connector. FIG. 4E shows a cross-sectional diagram of relationships between the coupling section 440 and the spring section 430 of the heat spreader 400, and between the heat spreader 400, the pivot connector 220, the motherboard 210, and the memory module 270 when the memory module is locked into the pivot connector.

Figure 5:
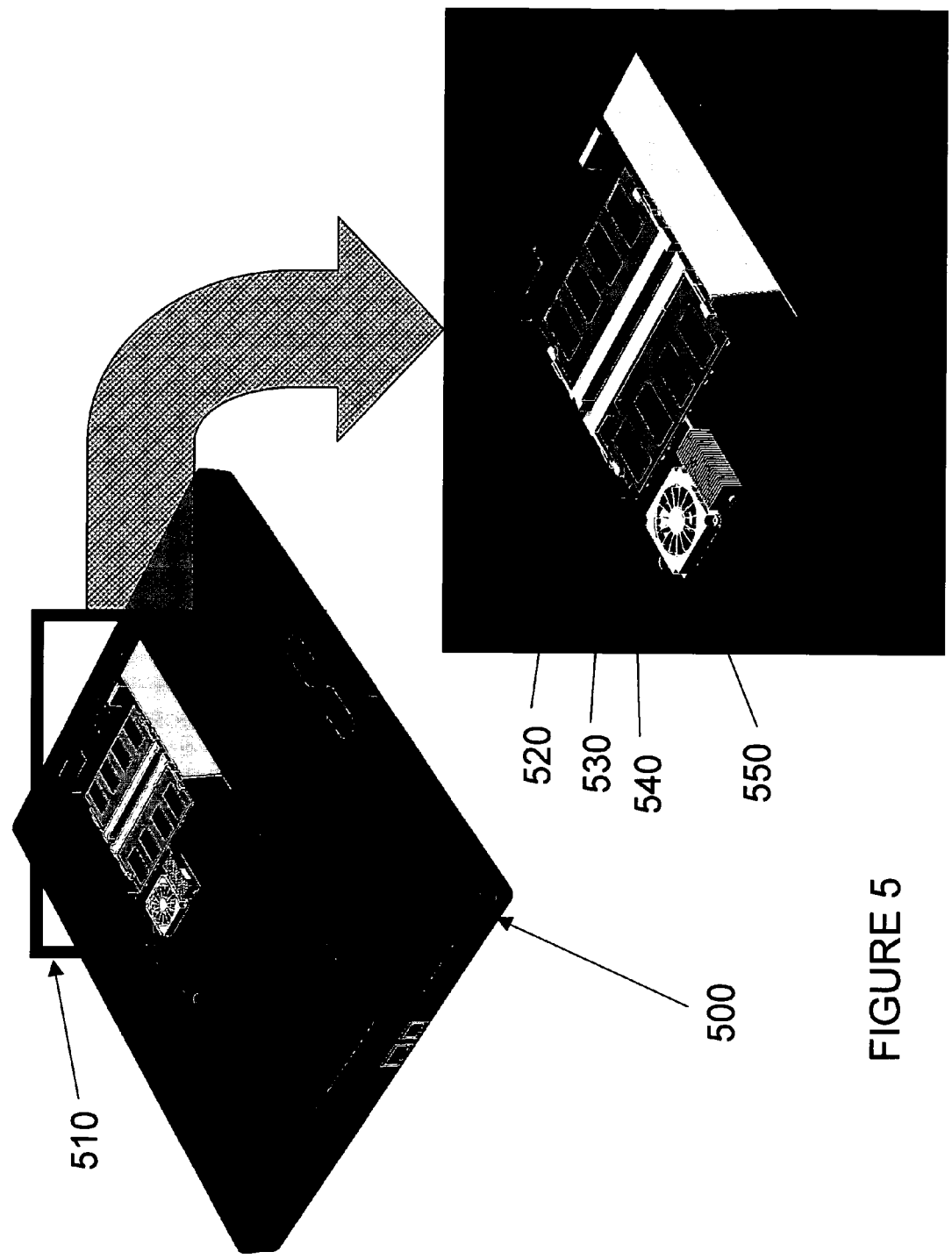
FIG. 5 shows a laptop computer system in which a heat spreader may be used to dissipate heat generated by a memory module.

FIG. 5 shows an example computer system 500 in which a heat spreader may be used to dissipate heat generated by a memory module. Although the computer system 500 shown in the figure is a laptop computer system, the system 500 may be any other computer system. The motherboard and memory modules of the system 500 are enclosed in a case. The figure shows a view of the memory module from the top of the case with the keyboard (and other devices/structures between the memory module and the keyboard) being removed. The memory module may be placed into or removed from the system from the top side of the case with the keyboard being removed. The memory module may also be placed into or removed from the system by a removable door on the back of the case. Box 510 shows how a memory module is placed in the computer system 500 when keyboard is removed. A pair of pivot connectors (520 and 530) are installed on and electronically connected to the motherboard (not shown in the figure) of the system 500. A memory module 540 (e.g., a SO-DIMM) may be inserted and locked into a pivot connector (e.g., 530). Underneath the memory module 540, there may be a heat spreader (not clearly shown in the figure), which is thermally coupled to a heat pipe. The heat spreader transfers heat generated by electronic components on the motherboard side of the memory module to the heat pipe, which further transfers the heat to a heat exchanger 550. The heat exchanger 550 may comprise a fan and a plurality of fins that help dissipate the heat into the ambient air.

Although not shown in FIG. 5, heat from the heat spreader may be transferred by the heat pipe to a heat exchanger which directly dissipates the heat into the air out of the box of the computing system. Additionally, the heat spreader may be thermally coupled to the keyboard of the computing system from which the heat is dissipated.

The above described embodiments show that the heat spreader is thermally coupled with a heat exchanger through a heat pipe or thermally coupled to the keyboard of the computing system. In another embodiment, components of the heat spreader (e.g., coupling members and/or spring members) may be extended beyond the width of the memory module so that the heat spreader may dissipate the heat generated by electronic components on the memory module directly into the ambient air. Yet in another embodiment, the heat spreader may be directly coupled to a heat exchanger to dissipate the heat generated by the electronic components.

Although certain example numerical ranges are given above for thickness, sizes, and values, these ranges are purely exemplary and may vary according to design needs. The values given may vary, for example, 10-30% above and below the respective endpoints of the ranges given above.

Furthermore, although an example embodiment of the present disclosure is described with reference to diagrams in FIGS. 1-5, persons of ordinary skill in the art will readily appreciate that many other methods of implementing the present invention may alternatively be used. For example, the order of execution of the functional blocks may be changed, and/or some of the functional blocks or structures described may be changed, eliminated, or combined.

In the preceding description, various aspects of the present disclosure have been described. For purposes of explanation, specific numbers, systems and configurations were set forth in order to provide a thorough understanding of the present disclosure. However, it is apparent to one skilled in the art having the benefit of this disclosure that the present disclosure may be practiced without the specific details. In other instances, well-known features, components, or modules were omitted, simplified, combined, or split in order not to obscure the present disclosure.

While this disclosure has been described with reference to illustrative embodiments, this description is not intended to be construed in a limiting sense. Various modifications of the illustrative embodiments, as well as other embodiments of the disclosure, which are apparent to persons skilled in the art to which the disclosure pertains are deemed to lie within the spirit and scope of the disclosure.

What is claimed is:

1. A heat spreader to dissipate heat generated by electronic components on a side of a heat-generating device, comprising:
    a first section having at least one thermally conductive coupling member, said at least one coupling member configured to engage a surface of at least one of the electronic components on the side of said heat-generating device; and
    a second section having at least one spring member, said at least one spring member deforming when said heat-generating device is locked into a pivot connector to provide pressure over the top of the spring member and pressurized engagement between the top surface of said at least one coupling member in said first section by the surface of at least one of the electronic components, and recovering when said heat-generating device is released from the pivot connector;
    said first section located on the top of and coupled to said second section.

2. The heat spreader of claim 1, wherein said first section comprises a layer of non-permanent thermal interface material on an upper surface of said at least coupling member, said layer of non-permanent thermal interface material having a height adjusted for at least one of the electronic components to secure thermal engagement between said upper surface and a surface of at least one of the electronic components.

3. The heat spreader of claim 1, further comprising means for securing said first section to said second section.

4. The heat spreader of claim 1, wherein said heat-generating device is releasably locked into the pivot connector, said pivot connector both electronically and mechanically coupled to a motherboard of a computer system; and when said heat-generating device is locked into said pivot connector, the side of said heat-generating device faces said motherboard, and a surface of at least one of the electronic components on the side of said heat-generating device is substantially parallel to said motherboard.

5. The heat spreader of claim 4, wherein said second section comprises means for securing said second section to at least one of said motherboard and said pivot connector.

6. The heat spreader of claim 1, wherein said heat-generating device comprises a memory module, the memory module including a small outline dual in-line memory module (SO-DIMM).

7. The heat spreader of claim 1, wherein said at least coupling member in said first section is thermally coupled to a heat pipe.

8. The heat spreader of claim 1, wherein said at least one spring member in said second section is thermally coupled to a heat pipe, said at least one spring member being thermally conductive and both thermally and mechanically coupled to said first section.

9. A system, comprising:
  a heat-generating device releasably locked into a pivot connector, said pivot connector both electronically and mechanically coupled to a motherboard of a computer system, said heat-generating device having electronic components on a side facing said motherboard and a surface of at least one of said electronic components being substantially parallel to said motherboard when said heat-generating device is locked into said pivot connector; and
  a heat spreader located on said motherboard to help dissipate heat generated by at least one of said electronic components on the motherboard side of said heat-generating device, said heat spreader engaging a surface of at least one of said electronic components when said heat-generating device is locked into said pivot connector, said heat spreader including: a first section having at least one said thermally conductive coupling member, said at lest one coupling member configured to engage a surface of at least one said electronic components on the motherboard side of said heat-generating device; and a second section having at least one spring member, said at least one spring member deforming when said heat generating device is locked into said pivot connector to provide pressure over the top of the spring member and pressurized engagement to the top surface of said at least one coupling member in said first section and the engaging surface of at least one of the electronic components, and recovering when said heat generating device is released from said pivot connector, and said first section located on said top of and coupled to said second section.

10. The system of claim 9, wherein said heat-generating device comprises a memory module, the memory module including a small outline dual in-line memory module (SO-DIMM).

11. The system of claim 9, wherein said first section comprises a layer of non-permanent thermal interface material on an upper surface of said at least coupling member, said layer of non-permanent thermal interface material having a height adjusted for at least one of said electronic components to secure thermal engagement between said upper surface and a surface of at least one of said electronic components.

12. The system of claim 9, wherein said heat spreader further comprises means for securing said first section to said second section.

13. The system of claim 9, wherein said second section comprises means for securing said second section to at least one of said motherboard and said pivot connector.

14. The system of claim 9, wherein said at least coupling member in said first section is thermally coupled to a heat pipe.

15. The system of claim 9, wherein said at least one spring member in said second section is thermally coupled to a heat pipe, said at least one spring member being thermally conductive and both thermally and mechanically coupled to said first section.

16. The system of claim 9, further comprising at least one ground pad to protect said motherboard and to provide electrical insulation between said motherboard and said heat spreader.

17. The system of claim 9, further comprising a heat exchanger hermally coupled to said heat spreader to dissipate the heat into ambient air.

18. The system of claim 17, wherein said heat exchanger comprises a fan and a plurality of fins to dissipate the heat into ambient air.

19. The system of claim 9, wherein the heat spreader is thermally coupled to a structure of a keyboard of the computer system, the structure of the keyboard dissipating the heat into ambient air.

* * * * *